United States Patent
Zhang et al.

(10) Patent No.: US 9,966,489 B2
(45) Date of Patent: May 8, 2018

(54) OVERHEAT PROTECTION DEVICE, OVERHEAT PROTECTION METHOD AND ELECTRICAL DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Jiannan Zhang, Beijing (CN); Bin Feng, Beijing (CN); Jianfeng Yuan, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 365 days.

(21) Appl. No.: 14/804,776

(22) Filed: Jul. 21, 2015

(65) Prior Publication Data

US 2016/0164276 A1 Jun. 9, 2016

(30) Foreign Application Priority Data

Dec. 4, 2014 (CN) .......................... 2014 1 0738050

(51) Int. Cl.
*H01L 31/08* (2006.01)
*H01L 31/0203* (2014.01)

(52) U.S. Cl.
CPC .......... *H01L 31/08* (2013.01); *H01L 31/0203* (2013.01)

(58) Field of Classification Search
CPC .......................... H01L 31/0203; H01L 31/08

(Continued)

(56) References Cited

U.S. PATENT DOCUMENTS

2006/0263733 A1* 11/2006 Furner ................ F21V 23/04
431/292
2011/0149373 A1* 6/2011 Liu ...................... G02F 1/0147
359/288

(Continued)

FOREIGN PATENT DOCUMENTS

CN 1834739 A 9/2006
CN 201546606 U 8/2010

(Continued)

OTHER PUBLICATIONS

First Office Action regarding Chinese application No. 201410738050.X, dated Dec. 29, 2016. Translation provided by Dragon Intellectual Property Law Firm.

*Primary Examiner* — Thienvu Tran
*Assistant Examiner* — Kevin J Comber
(74) *Attorney, Agent, or Firm* — Harness, Dickey & Pierce, P.L.C.

(57) ABSTRACT

The present disclosure provides an overheat protection device, an overheat protection method and an electrical device. The overheat protection device is used in an electrical device and includes a transparent window unit and an optically-controlled switch. The transparent window unit is made of a transparent material and arranged on a housing of the electrical device, and an inner surface of the transparent window unit is coated with a thermochromatic material film. The optically-controlled switch is arranged inside the housing of the electrical device and exposed to an ambient light beam through the transparent window unit. The optically-controlled switch is configured to turn off the electrical device when a spectrum of the received light beam is within a predetermined spectral range.

6 Claims, 1 Drawing Sheet

(58) Field of Classification Search
USPC .......................................................... 361/103
See application file for complete search history.

(56) References Cited

U.S. PATENT DOCUMENTS

| | | | |
|---|---|---|---|
| 2011/0159249 | A1 | 6/2011 | Choi |
| 2013/0300193 | A1* | 11/2013 | Reichow ................ B60R 16/03 307/10.1 |
| 2013/0335803 | A1* | 12/2013 | Bae .................... C03C 17/3417 359/288 |

FOREIGN PATENT DOCUMENTS

| | | |
|---|---|---|
| CN | 102853933 A | 1/2013 |
| CN | 103640460 A | 3/2014 |

\* cited by examiner

OVERHEAT PROTECTION DEVICE, OVERHEAT PROTECTION METHOD AND ELECTRICAL DEVICE

CROSS-REFERENCE TO RELATED APPLICATION

The present application claims a priority of the Chinese patent application No. 201410738050.X filed on Dec. 4, 2014, which is incorporated herein by reference in its entirety.

TECHNICAL FIELD

The present disclosure relates to the field of overheat protection technology, in particular to an overheat protection device, an overheat protection method and an electrical device.

BACKGROUND

Currently, along with the development of the high-end smart TVs toward large size and high resolution, the power consumption of an integrated circuit (IC) has been increased continuously, which thus results in an increase in the heat generated thereby. When a temperature exceeds 120° C., performance characteristics of the IC will be adversely affected, and thereby both the quality and the service life of the TV are under threat. Hence, it is required to provide the TV with an overheat protection system.

Generally, a commonly-used overheat protection device is designed on the basis of the circuit, and a relatively large burden is caused on an electrical device itself, and particularly on a circuit structure of a small electrical device. Moreover, before the electrical device is shut down due to overheat, there is no visible overheat early-warning.

SUMMARY

A main object of the present disclosure is to provide an overheat protection device, an overheat protection method and an electrical device, so as to achieve overheat protection without an additional circuit, to prevent an increase in a load of the electrical device itself, and to provide a visible overheat early-warning.

In one aspect, the present disclosure provides in one embodiment an overheat protection device for use in an electrical device, including a transparent window unit and an optically-controlled switch. The transparent window unit is made of a transparent material and arranged on a housing of the electrical device, and an inner surface of the transparent window unit is coated with a thermochromatic material film. The optically-controlled switch is arranged inside the housing of the electrical device and exposed to an ambient light beam through the transparent window unit. The optically-controlled switch is configured to turn off the electrical device when a spectrum of the received light beam is within a predetermined spectral range.

Alternatively, the transparent window unit is made of transparent resin or glass.

Alternatively, the thermochromatic material film is made of a reversible organic thermochromatic material or a temperature indicating paint.

Alternatively, the optically-controlled switch is a photoresistor-type optically-controlled switch.

Alternatively, the photoresistor-type optically-controlled switch is a self-locking light-induced photoresistor-type optically-controlled switch, or a precise light-induced photoresistor-type optically-controlled switch.

In another aspect, the present disclosure provides in one embodiment an overheat protection method for using in the above-mentioned overheat protection device of an electrical device, including steps of: receiving, by an optically-controlled switch, an ambient light beam through a transparent window unit, and detecting a spectrum of the ambient light beam; and turning off the electrical device when the optically-controlled switch determines that the spectrum of the ambient light beam is within a predetermined spectral range.

In yet another aspect, the present disclosure provides in one embodiment an electrical device including the above-mentioned overheat protection device. A transparent window unit of the overheat protection device is arranged on a housing of the electrical device, and an optically-controlled switch of the overheat protection device is arranged inside the housing.

According to the overheat protection device, the overheat protection method and the electrical device in the embodiments of the present disclosure, the transparent window unit, the inner surface of which is coated with the thermochromatic material film, is arranged on the housing of the electrical device, and the optically-controlled switch is arranged inside the housing and exposed to the ambient light beam through the transparent window unit. During a temperature rise, the intensity of the light beam passing through the thermochromatic material film changes remarkably along with an increase in the light transmittance. As a result, it is able to trigger the optically-controlled switch which operates at a specific spectral range, so as to turn off the electrical device, thereby to achieve the overheat protection. As compared with the related art, it is able, in the present disclosure, to provide an overheat warning in an earlier and intuitive manner, to achieve the overheat protection in a simpler manner, and to reduce the load of the electrical device itself.

DETAILED DESCRIPTION

The present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may, without any creative effort, obtain the other embodiments, which also fall within the scope of the present disclosure.

Figure 1:
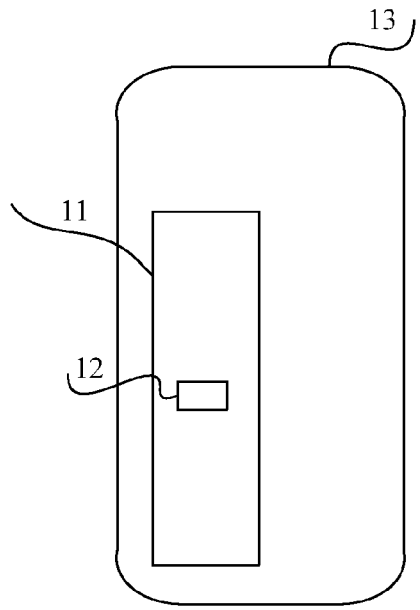
FIG. 1 is a top view of an overheat protection device according to one embodiment of the present disclosure.

As shown in FIG. 1, which is a top view showing an overheat protection device according to one embodiment of the present disclosure, the overheat protection device is used for an electrical device, and includes a transparent window unit 11 and an optically-controlled switch 12. The transparent window unit 11 is made of a transparent material and arranged on a housing 13 of the electrical device.

Figure 2:
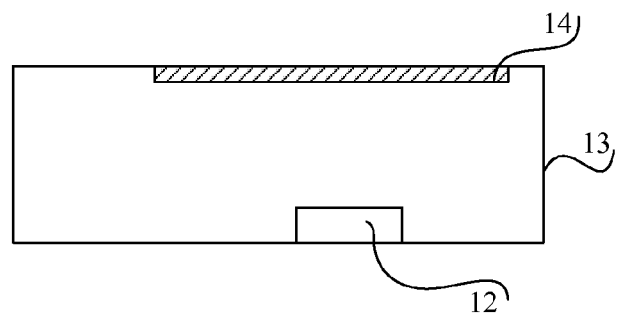
FIG. 2 is a left view of the overheat protection device according to one embodiment of the present disclosure.

As shown in FIG. 2, the optically-controlled switch 12 is arranged inside the housing 13 of the electrical device, an inner surface of the transparent window unit 11 (not shown)

is coated with a thermochromatic material film 14, and the optically-controlled switch 12 is exposed to an ambient light beam through the transparent window unit 11. The optically-controlled switch 12 is configured to turn off the electrical device when a spectrum of the received ambient light beam is within a predetermined spectral range.

In the embodiment of the present disclosure, the overheat protection device includes two parts. One is the transparent window unit 11 made of a transparent material and arranged on the housing 13 of the electrical device, and the inner surface of the transparent window unit 11 is coated with the thermochromatic material film 14. The other is the optically-controlled switch 12 arranged inside the electrical device. Generally, a thermochromatic material is colored under a room temperature. When heated to a certain temperature, it may be almost colorless, a transmission spectrum of the thermochromatic material may change from a short wavelength to a long wavelength, and its light transmittance may increase gradually. At this time, the intensity of the light beam passing through the thermochromatic material film 14 remarkably changes along with an increase in the light transmittance. As a result, it is able to trigger the optically-controlled switch 12 that operates at a specific spectral range, so as to turn off the electrical device, thereby to achieve the overheat protection. In addition, along with an increase in the temperature of the inner surface of the transparent window unit 11 on the housing 13 of the electrical device, a color of the thermochromatic material becomes lighter and lighter, and so does a color of the transparent window unit 11. Hence, a user may determine a temperature change of the electrical device intuitively and take measures to prevent the electrical device from being overheated as soon as possible, thereby to prevent a possible risk due to the overheat as well as to prolong a service life of the electrical device. In this way, it is able to provide an overheat warning in an earlier and intuitive manner, to achieve the overheat protection in a simpler manner, and to reduce a load of the electrical device itself.

In order to achieve an overheat protection function, it is required to provide the housing of the electrical device with the transparent window unit. Generally, the transparent window unit may be made of transparent resin or glass, which depends on the characteristics of the electrical device. The transparent window unit may be arranged at any position as long as the optically-controlled switch inside the housing of the electrical device is exposed to the ambient light beam through the transparent window unit.

The thermochromatic material film may be made of a reversible organic thermochromatic material or a temperature indicating paint. Generally, a color of the thermochromatic material continuously changes toward a short-wavelength spectrum along with an increase in its temperature, and becomes lighter and lighter, until it becomes almost colorless and transparent.

The optically-controlled switch may be a photoresistor-type optically-controlled switch. To be specific, the photoresistor-type optically-controlled switch may be a self-locking light-induced photoresistor-type optically-controlled switch, or a precise light-induced photoresistor-type optically-controlled switch.

Taking a condition where the overheat protection device is applied to a mobile power source as an example, the transparent window unit is made of transparent resin, and a thermochromatic material is coated onto an inner surface of the transparent window unit, so as to form a thermochromatic material film. Under a room temperature, the thermochromatic material is of a spectral color with a relatively long wavelength, e.g., red, and it has low light transmittance. At this time, an ambient light beam received by the light-induced optically-controlled switch, with a photoresistor as its core, inside the mobile power source is of a wavelength and intensity insufficient to trigger its turning-off operation. When the mobile power source reaches a certain temperature, the color of the transparent window unit starts to change. At this time, when a user is aware of this change, he may move the mobile power source to a place with a low temperature, so as to prevent the temperature of the mobile power source from increasing. When the user is unaware of this change, the temperature of the mobile power source may increase continuously until the light beam passing through the thermochromatic material is of a wavelength and intensity sufficient to trigger the optically-controlled switch. At this time, the temperature of the mobile power source reaches its warning level, and the optically-controlled switch turns off the mobile power source, so as to prevent the occurrence of a risk such as explosion, thereby to use the mobile power source in a safe manner. In addition, it is able to prevent the mobile power source from operating at a high temperature for a long period of time, thereby to prolong its service life.

Figure 3:
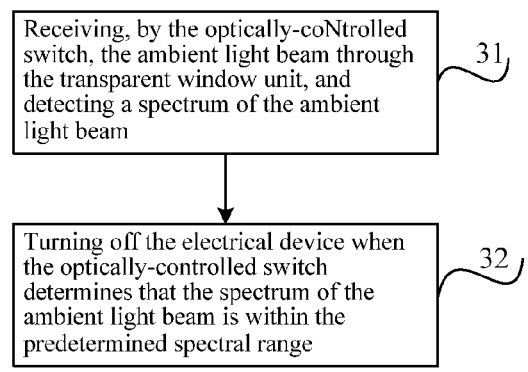
FIG. 3 is a flow chart of an overheat protection method according to one embodiment of the present disclosure.

As shown in FIG. 3, the present disclosure further provides in one embodiment an overheat protection method for using in the above-mentioned overheat protection device of an electrical device, which includes the following steps:

Step 31: receiving, by the optically-controlled switch, the ambient light beam through the transparent window unit, and detecting a spectrum of the ambient light beam; and Step 32: turning off the electrical device when the optically-controlled switch determines that the spectrum of the ambient light beam is within the predetermined spectral range.

The present disclosure further provides in one embodiment an electrical device including the above-mentioned overheat protection device. The transparent window unit of the overheat protection device is arranged on the housing of the electrical device, and the optically-controlled switch of the overheat protection device is arranged inside the housing.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An electrical device comprising:
a housing comprising a transparent window, and
an optically-controlled switch arranged inside the housing,
wherein the transparent window is made of a transparent material and an inner surface of the transparent window is coated with a thermochromatic material film; and
the optically-controlled switch is exposable to an ambient light beam from outside of the electrical device through the transparent window, and configured to turn off the electrical device in the case that a spectrum of the received ambient light beam through the transparent window is within a predetermined spectral range.

2. The electrical device according to claim 1, wherein the transparent window is made of transparent resin or glass.

3. The electrical device according to claim 1, wherein the thermochromatic material film is made of a reversible organic thermochromatic material or a temperature indicating paint.

4. The electrical device according to claim 1, wherein the optically-controlled switch is a photoresistor-type optically-controlled switch.

5. The electrical device according to claim 4, wherein the photoresistor-type optically-controlled switch is a self-locking light-induced photoresistor-type optically-controlled switch, or a precise light-induced photoresistor-type optically-controlled switch.

6. A method for overheat protection using the electrical device according to claim 1, comprising steps of:
   receiving, by an optically-controlled switch, an ambient light beam through a transparent window unit, and detecting a spectrum of the ambient light beam; and
   turning off the electrical device when the optically-controlled switch determines that the spectrum of the ambient light beam is within a predetermined spectral range.

\* \* \* \* \*